(12) United States Patent
Fujita et al.

(10) Patent No.: US 11,424,320 B2
(45) Date of Patent: Aug. 23, 2022

(54) P-TYPE OXIDE SEMICONDUCTOR AND METHOD FOR MANUFACTURING SAME

(71) Applicants: FLOSFIA INC., Kyoto (JP); KYOTO UNIVERSITY, Kyoto (JP)

(72) Inventors: Shizuo Fujita, Kyoto (JP); Kentaro Kaneko, Kyoto (JP); Toshimi Hitora, Kyoto (JP); Tomochika Tanikawa, Kyoto (JP)

(73) Assignees: FLOSFIA INC., Kyoto (JP); KYOTO UNIVERSITY, Kyoto (JP)

( * ) Notice: Subject to any disclaimer, the term of this patent is extended or adjusted under 35 U.S.C. 154(b) by 0 days.

(21) Appl. No.: 16/313,272

(22) PCT Filed: Jun. 30, 2017

(86) PCT No.: PCT/JP2017/024275
§ 371 (c)(1),
(2) Date: Dec. 26, 2018

(87) PCT Pub. No.: WO2018/004009
PCT Pub. Date: Jan. 4, 2018

(65) Prior Publication Data
US 2019/0157380 A1    May 23, 2019

(30) Foreign Application Priority Data
Jun. 30, 2016  (JP) .............................. JP2016-131156

(51) Int. Cl.
*H01L 29/10*     (2006.01)
*H01L 29/06*     (2006.01)
(Continued)

(52) U.S. Cl.
CPC .............. *H01L 29/06* (2013.01); *H01L 29/12* (2013.01); *H01L 29/24* (2013.01); *H01L 29/47* (2013.01);
(Continued)

(58) Field of Classification Search
CPC ......... H01L 29/12; H01L 29/14; H01L 29/47; H01L 29/739; H01L 29/06; H01L 29/78;
(Continued)

(56) References Cited

U.S. PATENT DOCUMENTS

| 7,126,054 B2 * | 10/2006 | Murai ................. H01G 9/2009 136/263 |
| 7,527,715 B2 * | 5/2009 | Fiot .......................... C25C 3/06 204/247.4 |

(Continued)

FOREIGN PATENT DOCUMENTS

| JP | 2005-340308 | 12/2005 |
| JP | 2011-204814 | 10/2011 |

(Continued)

OTHER PUBLICATIONS

International Search Report dated Sep. 26, 2017 in International (PCT) Application No. PCT/JP2017/024275.
(Continued)

*Primary Examiner* — Tan N Tran
(74) *Attorney, Agent, or Firm* — Wenderoth, Lind & Ponack, L.L.P.

(57) ABSTRACT

A new and useful p-type oxide semiconductor with a wide band gap and an enhanced electrical conductivity and the method of manufacturing the p-type oxide semiconductor are provided. A method of manufacturing a p-type oxide semiconductor including: generating atomized droplets by atomizing a raw material solution containing at least a d-block metal in the periodic table and a metal of Group 13 of the periodic table; carrying the atomized droplets onto a surface of a base by using a carrier gas; causing a thermal reaction of the atomized droplets adjacent to the surface of the base under an atmosphere of oxygen to form the p-type oxide semiconductor on the base.

6 Claims, 10 Drawing Sheets

(51) Int. Cl.
    *H01L 29/47*     (2006.01)
    *H01L 29/778*     (2006.01)
    *H01L 29/78*     (2006.01)
    *H01L 29/808*     (2006.01)
    *H01L 29/812*     (2006.01)
    *H01L 29/872*     (2006.01)
    *H01L 33/02*     (2010.01)
    *H01L 29/24*     (2006.01)
    *H01L 29/739*     (2006.01)
    *H01L 29/12*     (2006.01)
    *H02M 3/28*     (2006.01)
    *H01L 33/26*     (2010.01)

(52) U.S. Cl.
    CPC ........ *H01L 29/739* (2013.01); *H01L 29/7391* (2013.01); *H01L 29/778* (2013.01); *H01L 29/78* (2013.01); *H01L 29/808* (2013.01); *H01L 29/812* (2013.01); *H01L 29/872* (2013.01); *H01L 33/02* (2013.01); *H01L 33/26* (2013.01); *H02M 3/28* (2013.01)

(58) Field of Classification Search
    CPC . H01L 29/7391; H01L 29/778; H01L 29/808; H01L 29/812; H01L 29/872; H01L 33/26
    USPC .......................................................... 257/43
    See application file for complete search history.

(56) References Cited

U.S. PATENT DOCUMENTS

| | | | |
|---|---|---|---|
| 2007/0114528 A1 | 5/2007 | Herman et al. | |
| 2007/0200119 A1* | 8/2007 | Li | H01L 33/08 257/79 |
| 2008/0070383 A1* | 3/2008 | Herman | H01L 29/242 438/478 |
| 2011/0073179 A1* | 3/2011 | Lu | H01L 31/02322 136/256 |
| 2011/0079273 A1* | 4/2011 | Arango | H01L 51/4273 136/252 |
| 2012/0074434 A1* | 3/2012 | Park | H01L 33/56 257/88 |
| 2013/0133727 A1* | 5/2013 | Munteanu | H01L 31/0256 136/252 |
| 2015/0087110 A1 | 3/2015 | Facchetti et al. | |
| 2015/0325660 A1* | 11/2015 | Hitora | H01L 21/0257 257/43 |
| 2017/0022072 A1* | 1/2017 | Le Mercier | C01G 29/006 |

FOREIGN PATENT DOCUMENTS

| | | | |
|---|---|---|---|
| JP | 2013-058637 | * | 3/2013 |
| JP | 2013-58637 | | 3/2013 |
| JP | 2016-051825 | | 4/2016 |
| JP | 2016-081946 | | 5/2016 |
| KR | 10-2016-0026761 | | 3/2016 |

OTHER PUBLICATIONS

Kaneko, Kentaro, "Growth and Physical Properties of Corundum-Structured Gallium Oxide Alloy Thin Films", Dissertation, Kyoto Univ., Mar. 2013, pp. 1-116, with English Abstract.

Tatsuya, Takemoto, "Power Semiconductor Gallium Oxide", Thermal Conductivity, P-type . . . Overcoming Issues and Putting It Into Practical Use. [Online], EE Times, Japan, pp. 1-5, Retrieved Jun. 21, 2016 from http://eetimes.jp/ee/articles/1402/27/news028_2.html with partial English translation.

Koffyberg. F.P., "Optical Bandgaps and Electron Affinities of Semiconducting $Rh_2O_3(I)$ and $Rh_2O_3(III)$", J. Phys. Chem. Solids vol. 53, No. 10, pp. 1285-1288, 1992.

Hosono, Hideo, "Functional Development of Oxide Semiconductor" Physics Research, Electronic Version, vol. 3, No. 1, 031211 (Merger issue of Sep. 2013 and Feb. 2014), pp. 1-15, with partial English translation.

Extended European Search Report dated Feb. 6, 2020 in corresponding European Patent Application No. 17820363.4.

Japanese Notice of Reasons for Refusal dated Apr. 7, 2021 in corresponding Japanese Patent Application No. 2018-525323 with English translation.

Notification of Reason for Refusal dated May 27, 2021 in corresponding Korean Application No. 10-2018-7037576 with English translation.

Notice of Reasons for Refusal dated Aug. 31, 2021 issued in corresponding Japanese Patent Application No. 2018-525323 with English translation.

* cited by examiner peak 2θ = 39.3891

P-TYPE OXIDE SEMICONDUCTOR AND METHOD FOR MANUFACTURING SAME

TECHNICAL FIELD

The present invention relates to a p-type oxide semiconductor. Also, the present invention relates to a method for manufacturing a p-type oxide semiconductor. The present invention also relates to a semiconductor device including a p-type oxide semiconductor. Furthermore, the present invention relates to a semiconductor system including a p-type oxide semiconductor.

BACKGROUND ART

As a switching device of the next generation achieving high withstand voltage, low losses, and high temperature resistance, semiconductor devices using gallium oxide ($Ga_2O_3$) with a large band gap attract attention and are expected to be applied to power semiconductor devices including an inverter. Also, gallium oxide is expected to be applied to a light emitting and receiving element such as a light emitting diode (LED) and a sensor, since gallium oxide has a wide band gap. According to NPL 1, such gallium oxide has a band gap that may be controlled by forming mixed crystal with indium or aluminum singly or in combination and such a mixed crystal is extremely attractive materials as InAlGaO-based semiconductors. Here, InAlGaO-based semiconductors refers to $In_XAl_YGa_ZO_3$ ($0 \leq X \leq 2$, $0 \leq Y \leq 2$, $0 \leq Z \leq 2$, $X+Y+Z=1.5\sim2.5$) and can be viewed as the same material system containing gallium oxide.

In recent years, gallium oxide based p-type semiconductors have been studied. For example, PTL 1 describes a base showing p-type conductivity to be obtained by forming a $\beta$-$Ga_2O_3$-based crystal by floating zone method using MgO (p-type dopant source). Also, PTL 2 discloses to form a p-type semiconductor by using an ion implantation of a p-type dopant into $\alpha$-$(Al_xGa_{1-x})_2O_3$ single crystalline film obtained by Molecular Beam Epitaxy (MBE) method. However, NPL 2 discloses that a p-type semiconductor was not obtained by the methods disclosed in PTLs 1 and 2 (NPL 2). In fact, there has been no reports of any success in forming p-type semiconductor by use of the methods disclosed in PTLs 1 and 2. Therefore, feasible p-type oxide semiconductor and a method of manufacturing a p-type oxide semiconductor have been desired.

Also, NPLs 3 and 4 disclose a use of $Rh_2O_3$ or $ZnRh_2O_4$ as a p-type semiconductor, for example. Nevertheless, $Rh_2O_3$ has a problem that the raw material concentration becomes thin, which affects forming films. It was difficult to produce a single crystal of $Rh_2O_3$ even if using an organic solvent. Also, when Hall effect measurement was conducted, $Rh_2O_3$ and $ZnRh_2O_4$ were not determined to be p-type or the measurement itself could not be done. Further, for example, Hall coefficient of these semiconductors were measurement limit (0.2 $cm^3$/C) or less and they were not useful at all. As for $ZnRh_2O_4$ has a low mobility and a narrow band gap and thus, cannot be used as LED or power devices. Therefore, $Rh_2O_3$ and $ZnRh_2O_4$ were not necessarily satisfactory.

CITATION LIST

Patent Literature

PTL 1: JP2005-340308A
PTL 2: JP2013-58647A
Non Patent Literature

NPL 1: Kaneko, Kentaro, "Fabrication and physical properties of corundum structured alloys based on gallium oxide", Dissertation, Kyoto Univ., March 2013
NPL 2: Tatsuya, Takemoto, EE Times, Japan "power device gallium oxide" Thermal conductivity, p-type . . . overcoming issues and putting it into practical use. [online], Retrieved Jun. 21, 2016, from http://eetimes.jp/ee/articles/1402/27/news028_2.html
NPL 3: F. P. KOFFYBERG et al., "optical bandgaps and electron affinities of semiconducting Rh2O3(I) and Rh2O3 (III)", J. Phys. Chem. Solids Vol. 53, No. 10, pp. 1285-1288, 1992
NPL 4: Hideo Hosono, "Functional development of oxide semiconductor" Physics Research, Electronic version, Vol. 3, No. 1, 031211 (Merger issue of September 2013 and February 2014)

SUMMARY OF INVENTION

Technical Field

It is an object of a present inventive subject matter to provide a new and useful p-type oxide semiconductor with electrical conductivity. It is also an object of a present inventive subject matter to provide a method of manufacturing a p-type oxide semiconductor.

Solution to Problem

As a result of keen examination to achieve the object, the present inventors learned that a method of manufacturing a p-type oxide semiconductor including: generating atomized droplets by atomizing a raw material solution containing at least a d-block metal in the periodic table and a metal of Group 13 of the periodic table; carrying the atomized droplets onto a surface of a base by using a carrier gas; and causing a thermal reaction of the atomized droplets adjacent to the surface of the base under an atmosphere of oxygen to form the p-type oxide semiconductor on the base can form a p-type oxide semiconductor with enhanced electrical conductivity. Furthermore, the obtained p-type oxide semiconductor is useful for semiconductor device using $Ga_2O_3$ that has a wide band gap. They then found that such a p-type oxide semiconductor and the method of manufacturing the p-type oxide semiconductor are capable of solving the conventional problem as mentioned above.

After learning the above findings, the present inventors have made further research to complete the present invention. That is, the present invention relates to the followings.

[1] A method of manufacturing a p-type oxide semiconductor including: generating atomized droplets by atomizing a raw material solution including at least a d-block metal in the periodic table and a metal of Group 13 of the periodic table; carrying the atomized droplets onto a surface of a base by using a carrier gas; and causing a thermal reaction of the atomized droplets adjacent to the surface of the base under an atmosphere of oxygen to form the p-type oxide semiconductor on the base.

[2] The method of [1] above, wherein the d-block metal includes a transition metal.

[3] The method of [1] or [2] above, wherein the d-block metal includes a metal of Group 9 of the periodic table.

[4] The method of [3] above, wherein the metal of Group 9 includes rhodium, iridium or cobalt.

[5] The method of any of [1] to [4] above, wherein the metal of Group 13 includes at least one metal selected from among indium, aluminum, and gallium.

[6] The method any of [1] to [5] above, wherein the thermal reaction is conducted at a temperature that is 750° C. or lower.

[7] A p-type oxide semiconductor including: a metal oxide as a major component, the metal oxide including a d-block metal in the periodic table and a metal of Group 13 of the periodic table.

[8] The p-type oxide semiconductor of [7] above, wherein the d-block metal includes a transition metal.

[9] The p-type oxide semiconductor of [7] or [8] above, wherein the d-block metal includes a metal of Group 9 of the periodic table.

[10] The p-type oxide semiconductor of [9] above, wherein the metal of Group 9 includes rhodium, iridium, or cobalt.

[11] The p-type oxide semiconductor of any of [7] to [10] above, wherein the metal of Group 13 includes at least one metal selected from among indium, aluminum, and gallium.

[12] A semiconductor device including: a semiconductor layer including the p-type oxide semiconductor of any of [7] to [11] above; and an electrode.

[13] The semiconductor device of [12] above, further including: an n-type semiconductor layer including as a major component an oxide semiconductor that includes a metal of Group 13 of the periodic table.

[14] The semiconductor device of [13] above, wherein the metal of Group 13 includes at least one metal selected from among indium, aluminum, and gallium.

[15] A semiconductor system including: the semiconductor device of any of [12] to [14] above.

Advantageous Effects of Invention

The p-type oxide semiconductor of a present inventive subject matter is sufficient in electrical conductivity and in semiconductor properties as a p-type semiconductor. The method of manufacturing a p-type oxide semiconductor of the present invention is capable of producing the above-mentioned p-type oxide semiconductor industrially advantageously.

DESCRIPTION EMBODIMENTS

Figure 1:
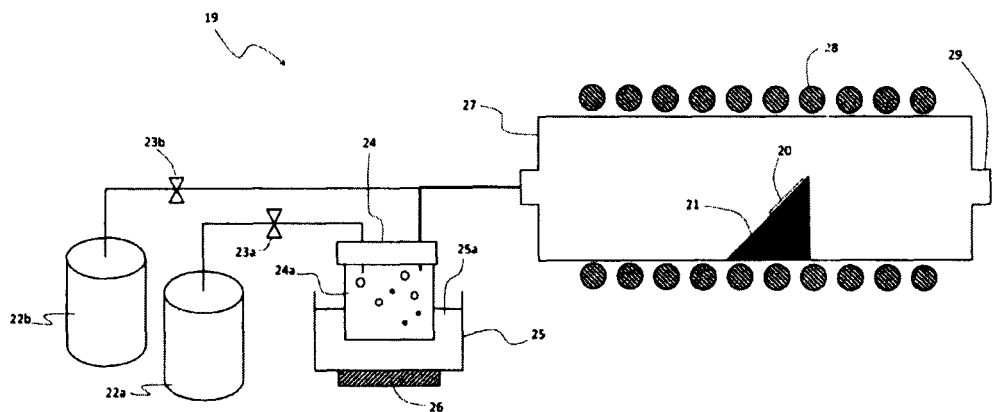
FIG. 1 shows a schematic diagram of a mist chemical vapor deposition (CVD) apparatus that may be used according to an embodiment of the present inventive subject matter.

Hereinafter, embodiments of a present inventive subject matter will be described in detail.

A p-type oxide semiconductor of the present inventive subject matter includes a p-type semiconductor containing a metal oxide as a major component and the metal oxide contains a d-block metal in the periodic table and a metal of Group 13 of the periodic table. The term "p-type oxide semiconductor" herein means an oxide semiconductor which is a p-type semiconductor. The p-type oxide semiconductor may be a crystal. Also, the p-type oxide semiconductor may be an amorphous. According to an embodiment of the present inventive subject matter, the p-type oxide semiconductor is preferably a mixed crystal. The term "metal oxide" herein means a material including a metal element and oxygen. The term "major component" herein means that the p-type oxide semiconductor contains a metal oxide that is 50% or more at atomic ratio in all the components in the p-type oxide semiconductor. According to an embodiment of the present inventive subject matter, the p-type oxide semiconductor may preferably contain the metal oxide that is 70% or more at atomic ratio in all the components in the p-type oxide semiconductor. For the present inventive subject matter, the p-type oxide semiconductor may further preferably contain the metal oxide that is 90% or more at atomic ratio in all the components in the p-type oxide semiconductor. The p-type oxide semiconductor may contain the metal oxide that is 100% at atomic ratio in all the components in the p-type oxide semiconductor. The term "periodic table" herein means the periodic table defined by the International Union of Pure and Applied Chemistry (IUPAC). The term "d-block metal" herein means an element that has electrons that fill the 3$d$, 4$d$, 5$d$, and 6$d$ orbitals.

Examples of a d-block metal in the periodic table include at least one metal selected from among scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lutetium (Lu), hafnium (Hf), tantalum (Ta), tungsten (W), rhenium (Re), osmium (Os), iridium (Ir), platinum (Pt), gold (Au), mercury (Hg), laurenzium (Lr), rutherfordium (Rf), dobnium (Db), seaborgium (Sg), bohrium (Bh), hassium (Hs), meitnerium (Mt), darmstadtium (Ds), roentgenium (Rg), and copernicium (Cn). According to an embodiment of the present inventive subject matter, the d-block metal in the periodic table may be a transition metal, may preferably be a metal of Group 9 of the periodic table, may be further preferably at least one metal selected from among rhodium, iridium and cobalt, and may be most preferably iridium. According to an embodiment of the present inventive subject matter, it is also preferable that the d-block metal includes Cr or Cu to increase a band gap of the p-type oxide semiconductor. The d-block metal is preferably contained to be 10% or more in atomic ratio in the major component except oxygen of the metal oxide. The d-block metal is further preferably in a range of 20% to 95% in atomic ratio in the major component except oxygen of the metal oxide.

Examples of the metal of Group 13 in the periodic table include aluminum (Al), gallium (Ga), indium (In), and thallium (Tl) and a combination of two or more metals thereof. According to an embodiment of the present inventive subject matter, the metal of Group 13 may preferably include at least one metal selected from among indium, aluminum, and gallium. According to an embodiment of the present inventive subject matter, the metal of Group 9 may further preferably include gallium or aluminum. According to an embodiment of the present inventive subject matter, if gallium is used as the metal of Group 13 of the periodic table, a wider bandgap is preferable. According to an embodiment of the present inventive subject matter, the metal of Group 13 may be contained to be 1% or more in atomic ratio in the major component except oxygen of the metal oxide, and further preferably to be 5% or more in atomic ratio in the major component except oxygen of the metal oxide.

Also, according to an embodiment of the present inventive subject matter, in case that the metal of Group 13 is at least one metal selected from among indium (In), aluminum (Al) and gallium (Ga), the d-block metal is preferably a metal selected from among metals of Group 4 to Group 9 for a reason that the p-type oxide semiconductor would obtain an enhanced p-type semiconductor property. The metal of Group 9 is further preferable.

The p-type oxide semiconductor is preferably obtained, by generating atomized droplets by atomizing a raw material solution including at least a d-block metal in the periodic table and a metal of Group 13 of the periodic table at (forming atomized droplets) as mentioned below, carrying the atomized droplets onto a surface of a base by using a carrier gas at (carrying atomized droplets) as mentioned below, and causing a thermal reaction of the atomized droplets adjacent to the surface of the base under an atmosphere of oxygen to form a p-type oxide semiconductor at (film-formation) as mentioned below.
(Forming Atomized Droplets)

In forming atomized droplets, a raw material solution is atomized to generate atomized droplets. A raw material solution may be atomized by a known method, and the method is not particularly limited, however, according to an embodiment of the present inventive subject matter, the raw material solution is preferably atomized by use of ultrasonic vibration. Atomized droplets obtained by using ultrasonic vibration have an initial velocity that is zero and floats in the space. Since atomized droplets floating in the space are carriable as a gas, the atomized droplets floating in the space are preferable to avoid damage caused by the collision energy without being blown like a spray. The size of droplets is not limited to a particular size, and may be a few mm, however, the size of the atomized droplets is preferably 50 µm or less. The size of the atomized droplets is preferably in a range of 0.1 µm to 10 µm.
(Raw Material Solution)

If the raw material solution contains the d-block metal and the metal of Group 13, the raw material solution is not particularly limited, and thus may contain an inorganic material and/or an organic material. However, according to an embodiment of the present inventive subject matter, the raw material solution containing the d-block metal and the metal of Group 13 in the form of complex or salt, and dissolved or dispersed in an organic solvent or water may be used. Examples of the form of the complex include acetylacetonate complexes, carbonyl complexes, ammine complexes, hydride complexes. Also, examples of the form of salt include organic metal salts (e.g., metal acetate, metal oxalate, metal citrate, etc.), metal sulfide salt, metal nitrate salt, metal phosphate salt, metal halide salt (e.g., metal chloride salt, metal bromide salt, metal iodide salt, etc.). According to a mist CVD method of the present inventive subject matter, the film formation may be preferably performed even when the raw material concentration is low.

A solvent of the raw material solution is not particularly limited, and thus, the solvent may be an inorganic solvent that includes water. The solvent may be an organic solvent that includes alcohol. The solvent may be a mixed solvent of the inorganic solvent and the organic solvent. According to an embodiment of the present inventive subject matter, unlike the conventional film-forming methods, the solvent may preferably contain water. Also, according to an embodiment of the present inventive subject matter, the solvent may be a mixed solvent of water and acid. Examples of water include pure water, ultrapure water, tap water, well water, mineral water, hot spring water, spring water, fresh water and ocean water. Examples of acid include inorganic acids such as hydrochloric acid, nitric acid, sulfuric acid, or organic acid such as acetic acid, propionic acid, and butanoic acid.
(Base)

The base is not particularly limited if the base is capable of supporting the p-type oxide semiconductor. The material for the base is also not particularly limited if an object of the present inventive subject matter is not interfered with, and the base may be a base of a known material. Also, the base may contain an organic compound and/or inorganic compound. Also, the base may be in any shape and may be valid for all shapes. Examples of the shape of the base include a plate shape, a flat shape, a disc shape, a fibrous shape, a rod shape, a cylindrical shape, a prismatic shape, a tubular shape, a spiral shape, a spherical shape, and a ring shape. According to an embodiment of the present inventive subject matter, a base may be preferably a substrate. Also, according to an embodiment of the present inventive subject matter, the thickness of the substrate is not particularly limited.

According to an embodiment of the present inventive subject matter, the substrate is not particularly limited if the substrate is capable of supporting the p-type oxide semiconductor and if the substrate is a plate shape. The substrate may be an electrically-insulating substrate, a semiconductor substrate or an electrically-conductive substrate, and also a substrate including film a metal on its surface. Examples of the substrate include a base substrate containing a substrate material with a corundum structure as a major component. The term "major component" herein means, for example, an atomic ratio of a substrate material with a certain crystal structure in all the elements in a substrate material may be 50% or more. According to an embodiment of the present inventive subject matter, the atomic ratio of the substrate material with a certain crystal structure in all the metal elements in the substrate material may be preferably 70% or more. For the present inventive subject matter, the atomic ratio of the substrate material with a certain crystal structure in all the metal elements in the substrate material may be further preferably 90% or more and may be 100%.

Furthermore, a material for the substrate is not particularly limited if an object of the present inventive subject matter is not interfered with, and also, the material may be a known one. Preferable examples of a substrate with a corundum structure include a sapphire substrate (preferably, a c-plane sapphire substrate), or an $\alpha$-$Ga_2O_3$ substrate.

(Carrying Atomized Droplets)

In carrying atomized droplet, the atomized droplets are delivered into the base by carrier gas. The carrier gas is not particularly limited if an object of the present inventive subject matter is not interfered with, and thus, the carrier gas may be oxygen, ozone, an inert gas such as nitrogen and argon. Also, the carrier gas may be a reducing gas such as hydrogen gas and/or forming gas. The carrier gas may contain one or two or more gasses. Also, a diluted carrier gas at a reduced flow rate (e.g., 10-fold diluted carrier gas) and the like may be used further as a second carrier gas. The carrier gas may be supplied from one or more locations. While the flow rate of the carrier gas is not particularly limited, the flow rate of the carrier gas may be in a range of 0.01 to 20 L/min. According to an embodiment of the present inventive subject matter, the flow rate of the carrier gas may be preferably in a range of 1 to 10 L/min. When a diluted carrier gas is used, the flow rate of the diluted carrier gas may be in a range of 0.001 to 2 L/min. Furthermore, according to an embodiment of the present inventive subject matter, when a diluted carrier gas is used, the flow rate of the diluted carrier gas may be preferably in a range of 0.1 to 1 L/min.

(Film-Formation)

In the film formation, the p-type oxide semiconductor is formed on at least a part of the base by a thermal reaction of the atomized droplets adjacent to the surface of the base. The thermal reaction is not particularly limited if the atomized droplets react on heating, and reaction conditions are not particularly limited if an object of the present inventive subject matter is not impaired. In the film-formation, the thermal reaction is conducted at an evaporation temperature or higher temperature of the evaporation temperature of the solvent of the raw material solution. During the thermal reaction, the temperature should not be too high. For example, the temperature during the thermal reaction may be 750° C. or less. The temperature during the thermal reaction may be preferably 500° C. to 750° C. The thermal reaction may be conducted in any atmosphere of a vacuum, a non-oxygen atmosphere, a reducing-gas atmosphere, and an atmosphere of oxygen. Also, the thermal reaction may be conducted in any condition of under an atmospheric pressure, under an increased pressure, and under a reduced pressure. According to an embodiment of the present inventive subject matter, the thermal reaction is preferably conducted in an atmosphere of oxygen. Also, according to an embodiment of the present inventive subject matter, the thermal reaction is preferably conducted under an atmospheric pressure. The thermal reaction is further preferably conducted in an atmosphere of oxygen and under an atmospheric pressure. Also, a film thickness of the p-type oxide semiconductor is able to be set by adjusting a film formation time. The film thickness of the p-type oxide semiconductor may be 1 µm or more and may be 1 µm or less. When the film thickness of the p-type oxide semiconductor is 1 µm or less, the film thickness may be 500 nm or less, and may be preferably 100 nm or less, and further preferably is 50 nm to 100 nm. Also, when the film thickness is 1 µm or more, the film thickness may be 3 µm or more and may be preferably 3 µm to 100 µm.

According to an embodiment of the present inventive subject matter, the p-type oxide semiconductor may be provided directly on the base or may be provided via another layer such as a semiconductor layer (n-type semiconductor layer, $n^-$-type semiconductor layer, $n^-$-type semiconductor layer, for example) that is different from a semiconductor layer of the p-type oxide semiconductor, an insulating layer including a semi-insulating layer, or a buffer layer on the base. Examples of the semiconductor layer and the insulating layer include a semiconductor layer including the metal of Group 13 of the periodic table and an insulating layer including the metal of Group 9 Group 13 of the periodic table. Preferable examples of the buffer layer include a semiconductor layer with a corundum structure, an insulating layer with a corundum structure, and a conductive layer with a corundum structure. Examples of the semiconductor layer may include $\alpha$-$Fe_2O_3$, $\alpha$-$Ga_2O_3$, or $\alpha$-$Al_2O_3$. A method of forming the buffer layer on the base is not particularly limited and may be by use of a method similarly to a method of forming the p-type oxide semiconductor as mentioned above.

The p-type oxide semiconductor obtained by above-mentioned method is able to be used for a semiconductor device as a p-type semiconductor layer. The p-type oxide semiconductor is particularly useful for a power device. Semiconductor devices may be categorized into lateral devices and vertical devices. In a lateral device, a first electrode and a second electrode may be formed on one side of a semiconductor layer. In a vertical device, a first electrode may be formed on a first side of a semiconductor layer, and a second electrode may be formed on a second side of the semiconductor layer. The first side may be positioned opposite to the second side of the semiconductor layer. According to an embodiment of a present inventive subject matter, the p-type oxide semiconductor may be used for the lateral devices and also used for vertical devices. According to an embodiment of the present inventive subject matter, the p-type oxide semiconductor may be preferably used for vertical devices. Examples of the semiconductor device include Schottky barrier diodes (SBDs), metal semiconductor field-effect transistors (MESFETs), high-electron-mobility transistors (HEMTs), metal oxide semiconductor field-effect transistors (MOSFETs), static induction transistors (SITs), junction field-effect transistors (JFETs), insulated gate bipolar transistors (IGBTs), and light emitting diodes.

FIG. 3 to 9 show examples of using the p-type oxide semiconductor of the present inventive subject matter as a p-type semiconductor layer. According to an embodiment of the present inventive subject matter, an n-type semiconductor may be a semiconductor containing the same major component as the major component of the p-type semiconductor layer and an n-type dopant. The n-type semiconductor may be a semiconductor containing a different major component that is different from the major component of the p-type oxide semiconductor. Also, the n-type semiconductor may be used as an $n^-$-type semiconductor layer or an $n^+$-type semiconductor layer by using known method such as adjusting a concentration of n-type dopant in the n-type semiconductor.

Figure 3:
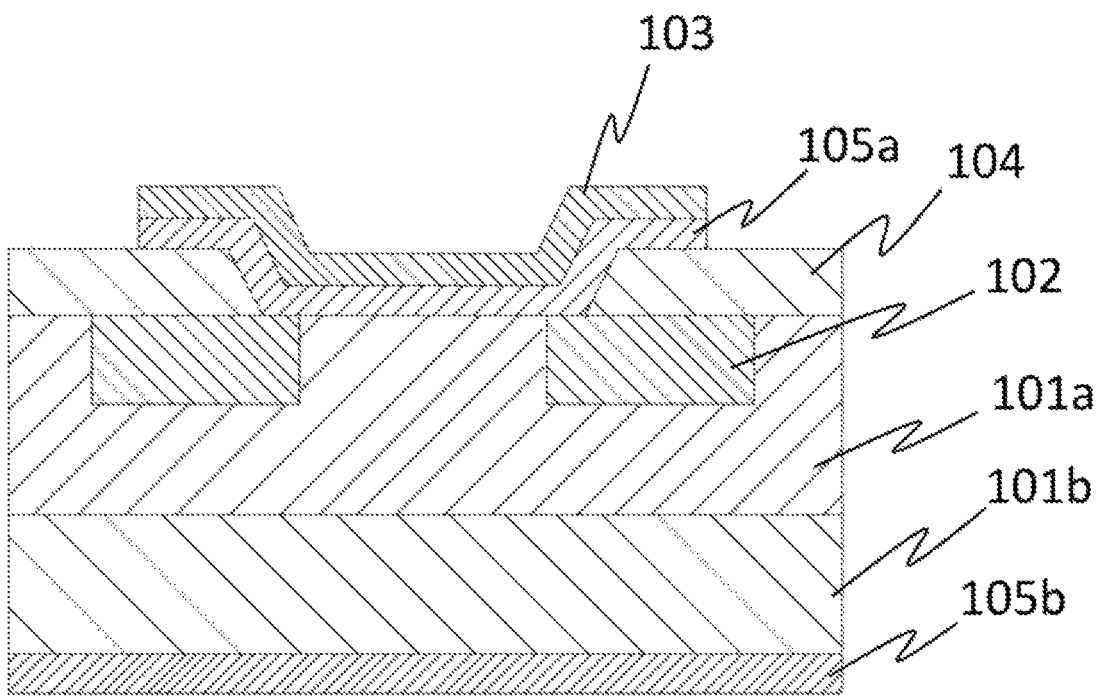
FIG. 3 shows a schematic view of an embodiment of a Schottky barrier diode (SBD) according to a present inventive subject matter.
Figure 4:
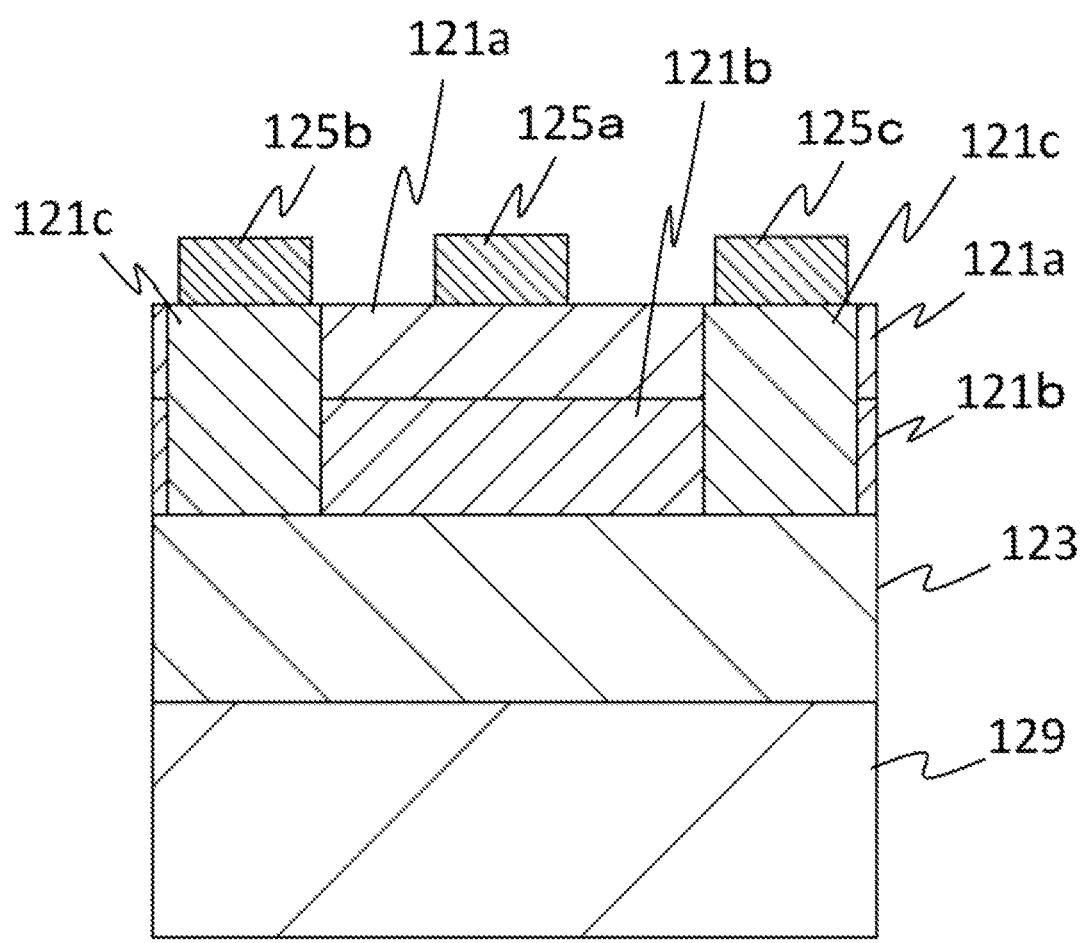
FIG. 4 shows a schematic view of an embodiment of a high electron mobility transistor (HEMT) according to the present inventive subject matter.

FIG. 3 shows a schematic view of an embodiment of a Schottky barrier diode (SBD) according to the present inventive subject matter including an $n^-$-type semiconductor layer 101a, an $n^+$-type semiconductor layer 101b, a p-type semiconductor layer 102, a metal layer 103, an insulating layer 104, a Schottky electrode 105a and an Ohmic electrode 105b. The metal layer 103 is comprised of a metal such as aluminum and covers the Schottky electrode 105a. FIG. 4 shows a schematic view of an embodiment of a high-electron-mobility transistor (HEMT) according to the present inventive subject matter including an n-type semiconductor layer with wide band gap 121a, an n-type semiconductor layer with narrow band gap 121b, an n+-type semiconductor layer 121c, a p-type semiconductor layer 123, a gate electrode 125a, a source electrode 125b, a drain electrode 125c, and a substrate 129.

The material of the Schottky electrode and the Ohmic electrode may be a known electrode material. Examples of such an electrode material include metals, containing Al, Mo, Co, Zr, Sn, Nb, Fe, Cr, Ta, Ti, Au, Pt, V, Mn, Ni, Cu, Hf, W, Ir, Zn, In, Pd, Nd, Ag and/or alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials.

Also, the Schottky electrode and the Ohmic electrode can be formed by a known method such as vacuum evaporation or sputtering. For more details, when forming the Schottky electrode, a first layer containing Mo is formed and a second layer containing Al is formed on the first layer. Then using photolithography, for example, can form a pattern at the first layer and at the second layer.

Examples of the material of the insulating layer include GaO, AlGaO InAlGaO, AlInZnGaO$_4$, Al, Hf$_2$O$_3$, SiN, SiON, Al$_2$O$_3$, MgO, GdO, SiO$_2$, and/or Si$_3$N$_4$. According to an embodiment of the present inventive subject matter, the insulating layer may preferably contains a corundum structure. The insulating layer can be formed by a known method such as sputtering, vacuum evaporation or CVD method.

Figure 5:
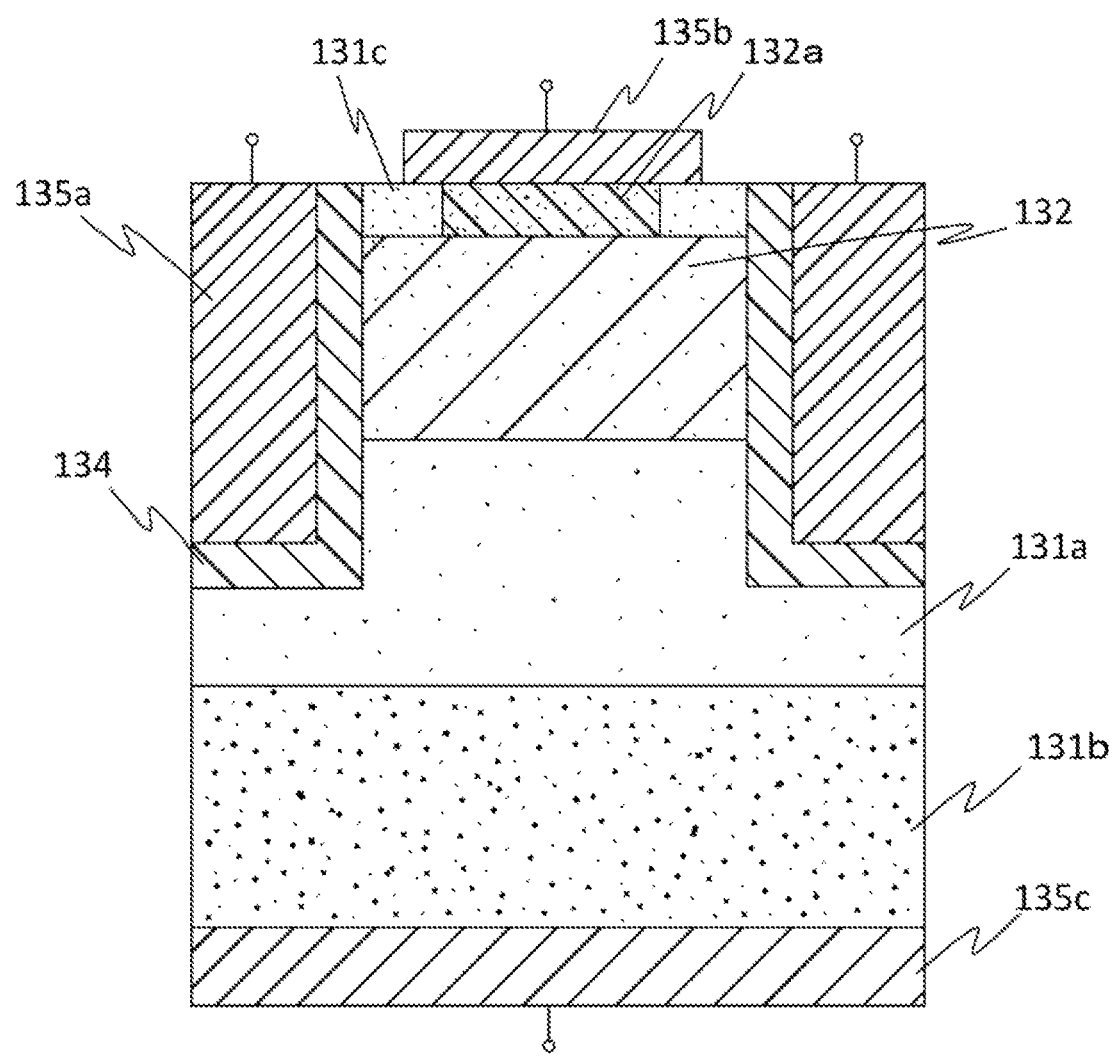
FIG. 5 shows a schematic view of an embodiment of a metal oxide semiconductor field effect transistor (MOSFET) according to the present inventive subject matter.
Figure 6:
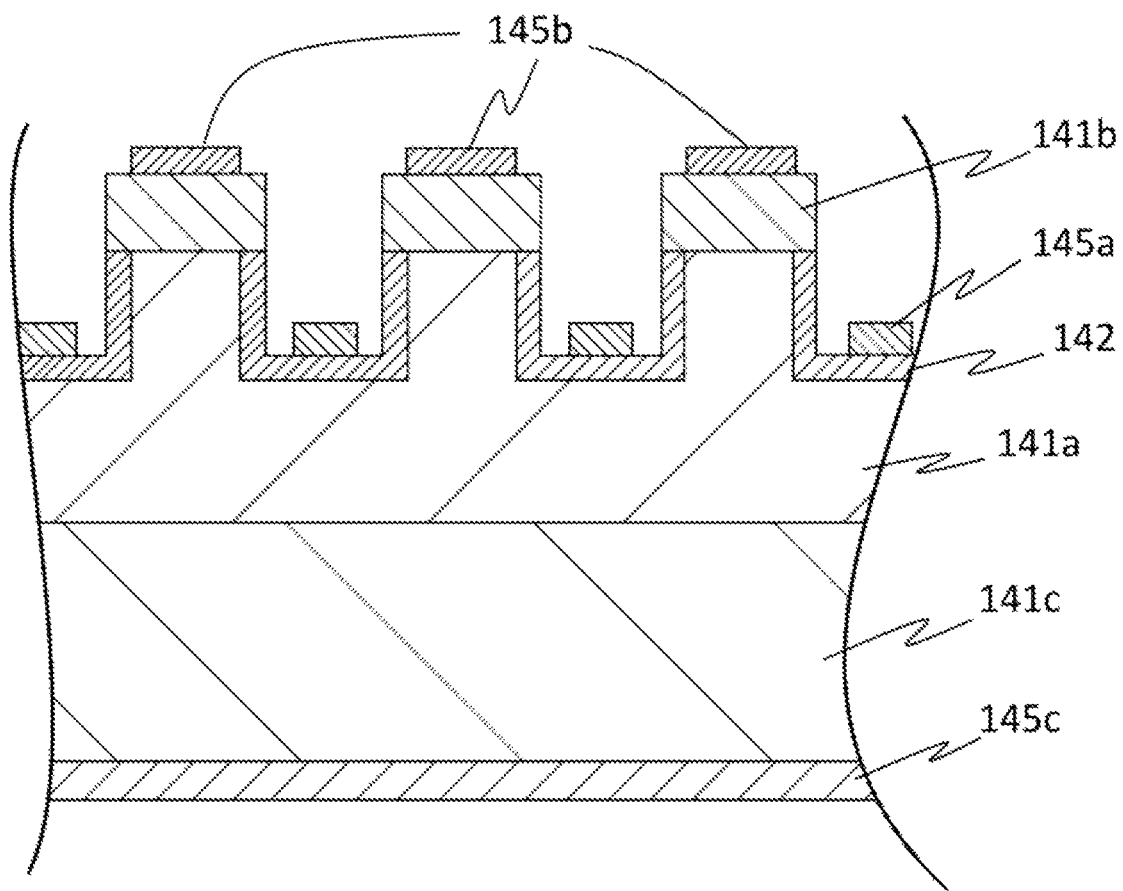
FIG. 6 shows a schematic view of an embodiment of junction field effect transistor (JFET) according to the present inventive subject matter.
Figure 7:
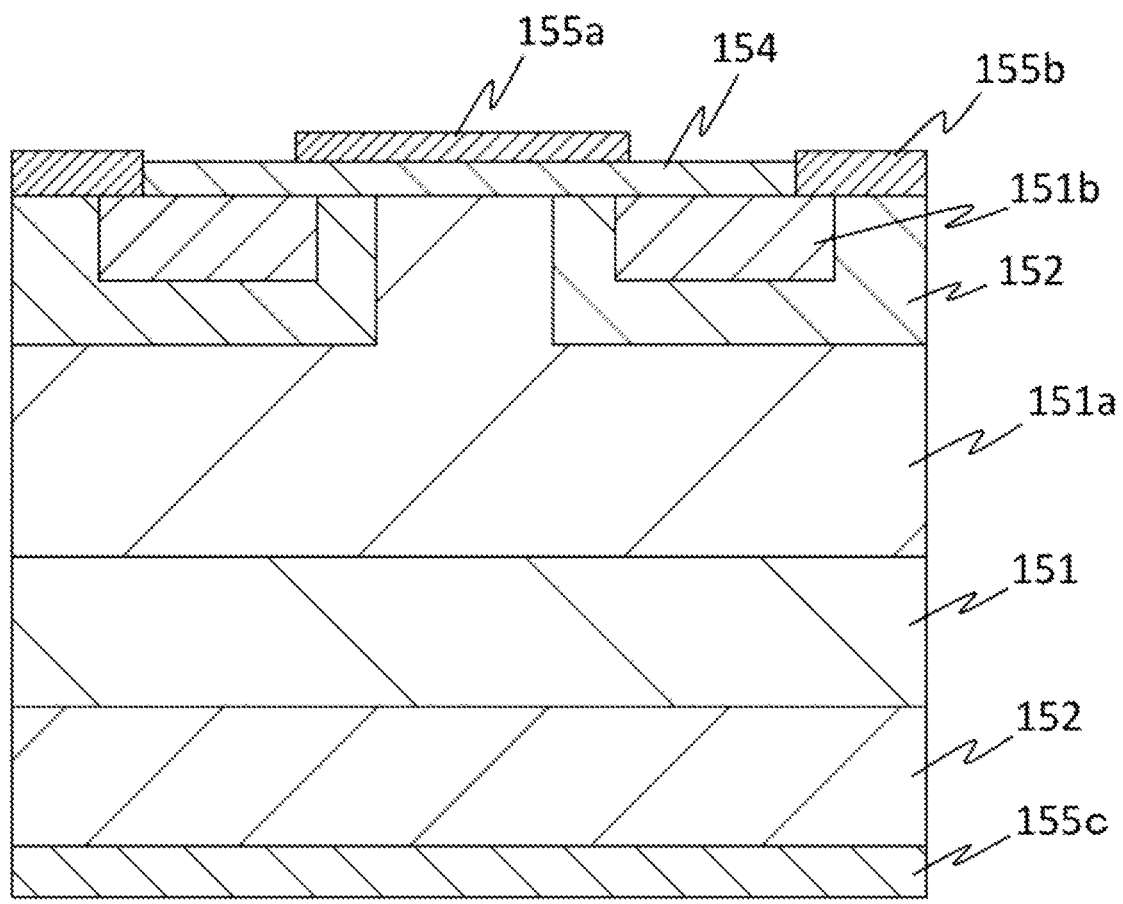
FIG. 7 shows a schematic view of an embodiment of insulated gate bipolar transistor (IGBT) according to the present inventive subject matter.

FIG. 5 shows a schematic view of an embodiment of a metal oxide semiconductor field-effect transistors (MOSFET) according to the present inventive subject matter. The MOSFET includes an n$^-$-type semiconductor layer 131a, a first n$^+$-type semiconductor layer 131b, a second n$^+$-type semiconductor layer 131c, a p-type semiconductor layer 132, a p$^+$-type semiconductor layer 132a, a gate insulating layer 134, a gate electrode 135a, a source electrode 135b and a drain electrode 135c. FIG. 6 shows a schematic view of an embodiment of a junction field-effect transistors (JFET) according to the present inventive subject matter including an n$^-$-type semiconductor layer 141a, a first n$^+$-type semiconductor layer 141b, a second n$^+$-type semiconductor layer 141c, a p-type semiconductor layer 142, a gate electrode 145a, a source electrode 145b and a drain electrode 145c. FIG. 7 shows a schematic view of an embodiment of an insulated gate bipolar transistors (IGBT) according to the present inventive subject matter including an n-type semiconductor layer 151, an n$^-$-type semiconductor layer 151a, an n$^+$-type semiconductor layer 151b, a p-type semiconductor layer 152, a gate insulating layer 154, a gate electrode 155a, an emitter electrode 155b and a collector electrode 155c.

Figure 8:
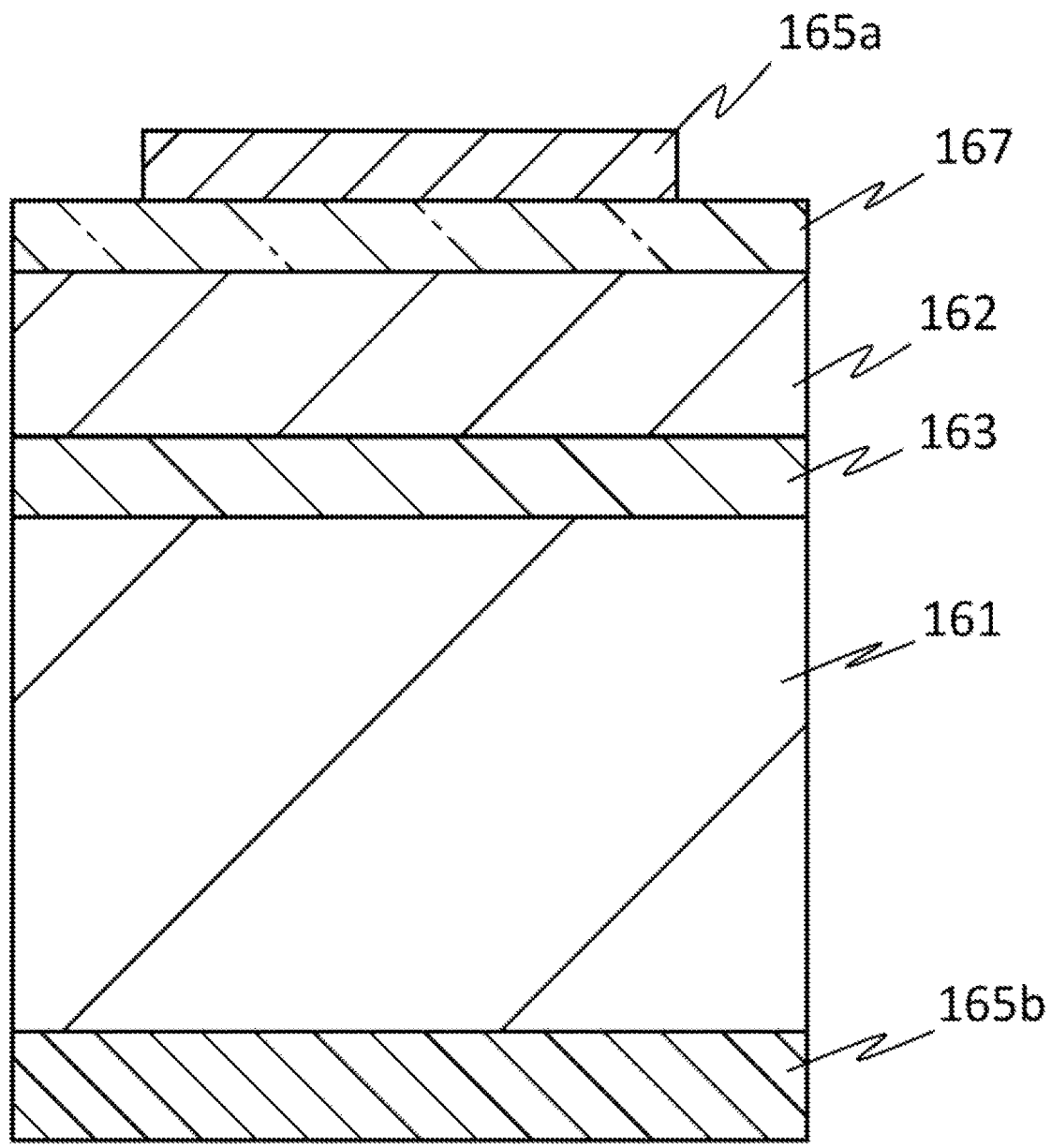
FIG. 8 shows a schematic view of an embodiment of light emitting diode (LED) according to the present inventive subject matter.

FIG. 8 shows a schematic view of an embodiment of a light emitting diode (LED) according to the present inventive subject matter. The LED shown in FIG. 8 includes an n-type semiconductor layer 161 on a second electrode 165b, and a light emitting layer 163 is positioned on the n-type semiconductor layer 161. Also, a p-type semiconductor layer 162 is positioned on the light emitting layer 163. A light-transmitting electrode 167, that permeates the light generated in the light emitting layer 163, is provided on the p-type semiconductor layer. A first electrode is positioned on the light-transmitting electrode 167. A light emitting material used for the light emitting layer may be a known material. The light emitting device shown in FIG. 8 may be covered with a protective layer except for the electrode portion.

Examples of the material of the light-transmitting electrode may include oxide conductive material containing indium or titanium. Regarding the material of the light-emitting electrode, in detail, the material may be In$_2$O$_3$, ZnO, SnO$_2$, Ga$_2$O$_3$, TiO$_2$, CeO$_2$, a mixed crystal thereof. The material may contain a dopant. By providing those materials using known method such as sputtering, the light-transmitting electrode would be formed. Also, annealing may be carried out after forming the translucent electrode, in order to make the electrode more transparent.

According to the light emitting diode of FIG. 8, the light-emitting layer 163 is configured to emit light by applying a current to the p-type semiconductor layer 162, the light emitting layer 163, and the n-type semiconductor layer, through the first electrode 165a as a positive electrode and the second electrode 165b as a negative electrode.

Examples of the material of the first electrode 165a and the second electrode 165b include Al, Mo, Co, Zr, Sn, Nb, Fe, Cr, Ta, Ti, Au, Pt, V, Mn, Ni, Cu, Hf, W, Ir, Zn, In, Pd, Nd, Ag and/or alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials. A forming method of the first and the second electrode is not particularly limited. Examples of the forming method of the first and the second electrode include wet methods such as printing method, spray method, coating method, physical methods such as vacuum deposition method, sputtering method, ion plating method, chemical methods such as CVD method, plasma CVD method. The forming method may be selected from above mentioned methods in consideration of a suitability for the material of the first electrode and the second electrode.

Figure 9:
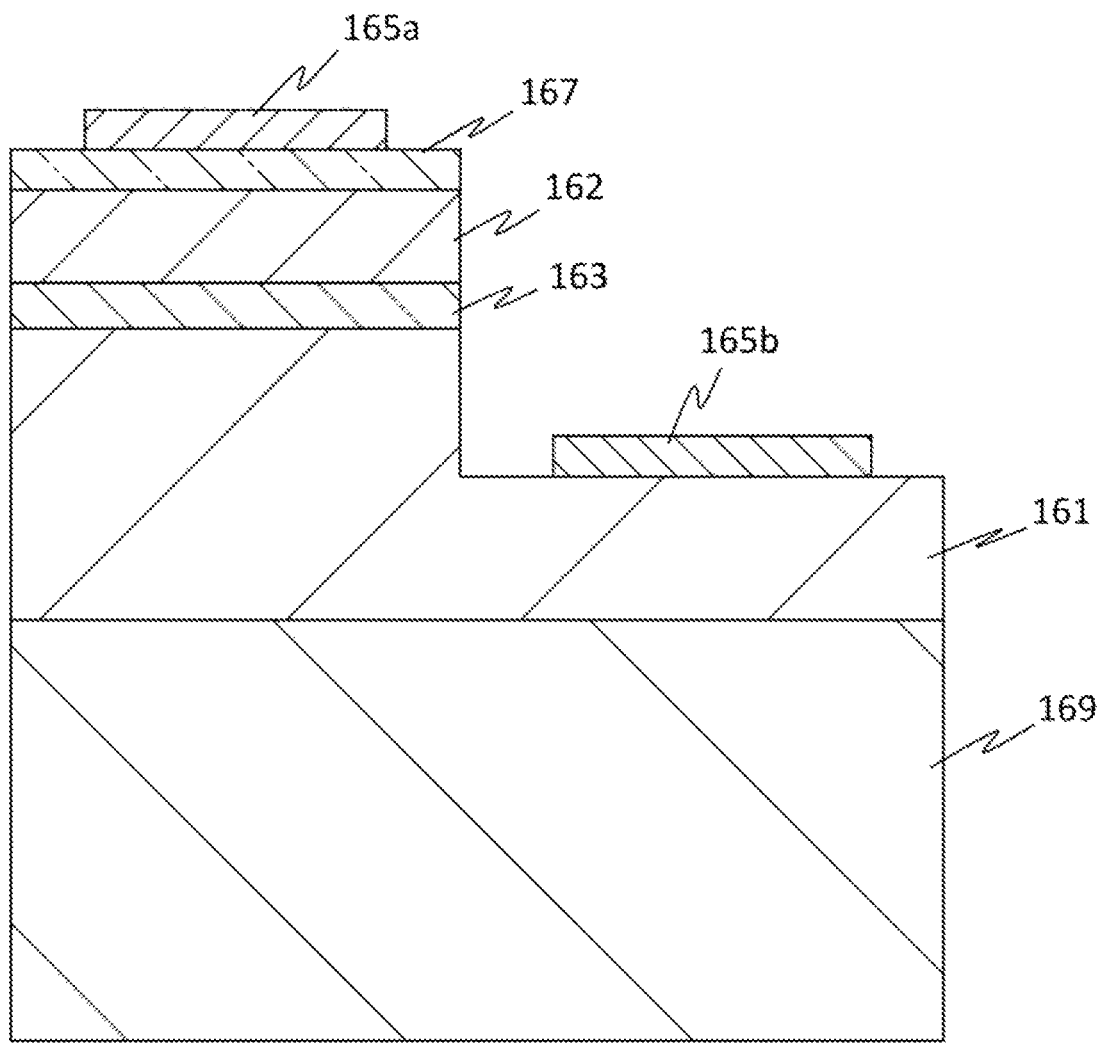
FIG. 9 shows a schematic view of an embodiment of light emitting diode (LED) according to the present inventive subject matter.

FIG. 9 shows a schematic view of another embodiment of a light emitting diode (LED) according to the present inventive subject matter. In the LED of FIG. 9, an n-type semiconductor layer 161 is arranged on the substrate 169, and the second electrode 165b is arranged on a part of the exposed surface of the n-type semiconductor layer 161, in which the exposed surface is formed by cutting out a part of a p-type semiconductor layer 162, light-emitting layer 163 and the n-type semiconductor layer 161.

Figure 10:
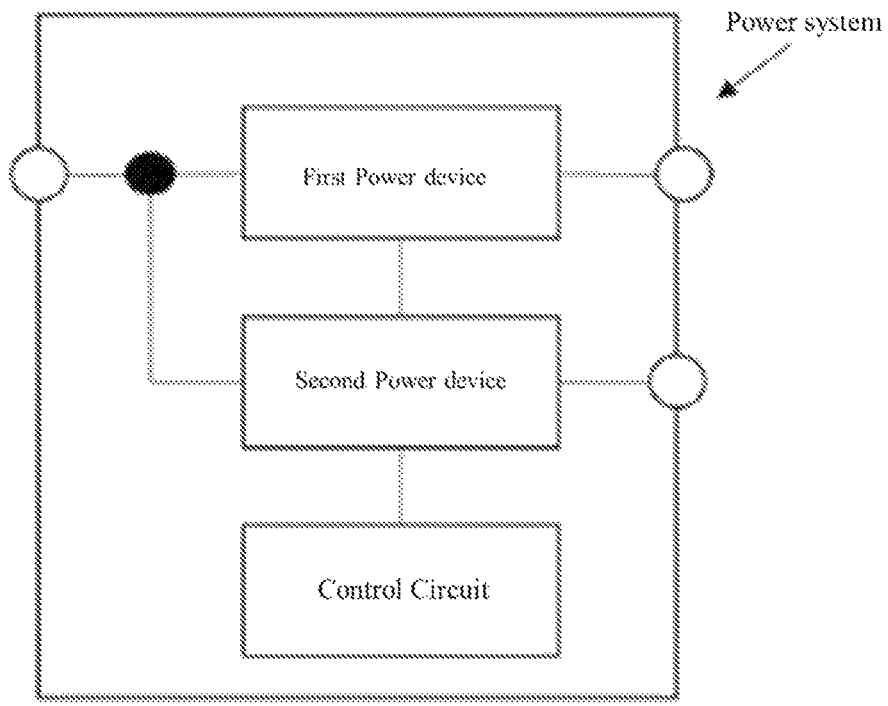
FIG. 10 shows a schematic view of a power system according to an embodiment of the present inventive subject matter.
Figure 11:
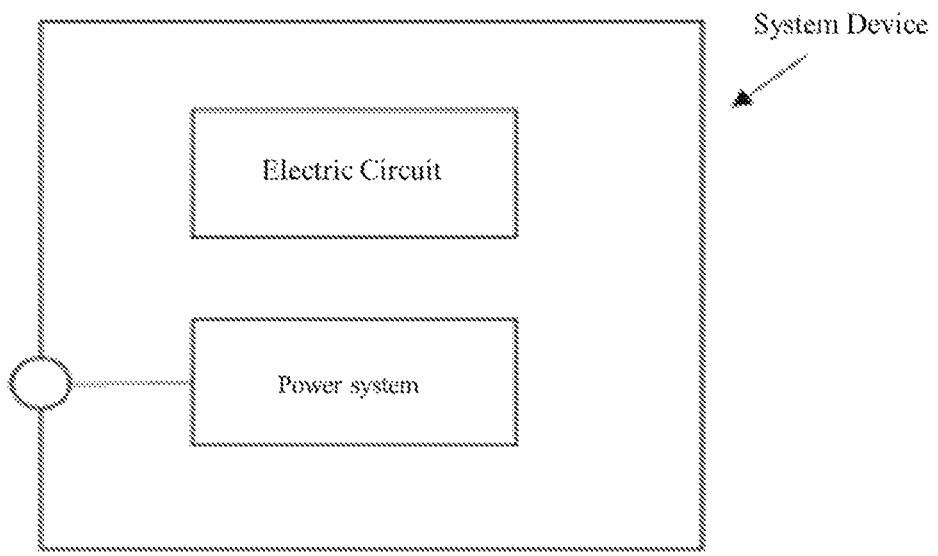
FIG. 11 shows a schematic view of a system device according to an embodiment of the present inventive subject matter.
Figure 12:
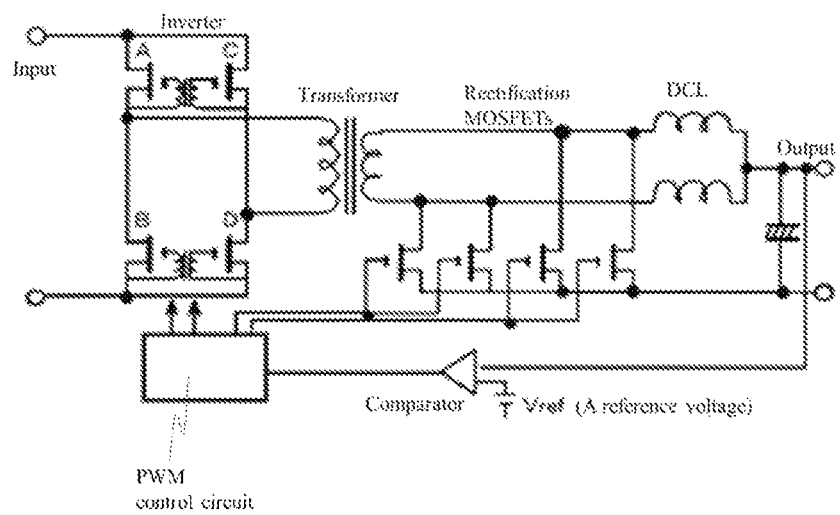
FIG. 12 shows a schematic view of a circuit diagram of power supply circuit of a power device according to an embodiment of the present inventive subject matter.

In addition, according to an embodiment of the present inventive subject matter, the semiconductor device may be used in a semiconductor system including a power source. The power source may be obtained by electrically connecting the semiconductor device to a wiring pattern using a known method. FIG. 10 shows a schematic view of a power system according to an embodiment of the present inventive subject matter. The semiconductor system of FIG. 10 includes two or more power devices (power sources) and a control circuit. The power system may be used for a system device in combination with an electric circuit, as shown in FIG. 11. FIG. 12 shows a schematic view of a circuit diagram of a power supply circuit of a power device including a power circuit and a control circuit. A DC voltage is switched at high frequencies by an inverter (configured with MOSFET A to D) to be converted to AC, followed by an insulation and transformation by a transformer. The voltage is the rectified by rectification MOSFETs and the smoothed by a DCL (smoothing coils L1 and L2) and a capacitor to output a direct current voltage. At this point, the output voltage is compared with a reference voltage by a voltage comparator to control the inverter and the rectification MOSFETs by a PWM control circuit to have a desired output voltage.

EXAMPLE

1. Film-Formation Apparatus

Regarding a film-formation apparatus, a mist CVD apparatus 19 used in an embodiment of a method according to the present inventive subject matter is described with FIG. 1. The mist CVD apparatus 19 includes a susceptor 21 on which a substrate 20 is placed. The mist CVD apparatus 19 includes a carrier gas supply device 22a, a first flow-control valve 23a that is configured to control a flow of carrier gas sent from the carrier gas supply device 22a, a diluted carrier gas supply device 22b, a second flow-control valve 23b to control a flow of a carrier gas that is configured to be sent from the diluted carrier gas supply device 22b, a mist generator 24 in that a raw material solution 24a is contained, a vessel 25 in that water 25a is contained, an ultrasonic transducer 26 attached to a bottom of the vessel 25, a supply pipe 27 that may be a quartz pipe with an inside diameter that may be 40 mm, and a heater 28 arranged at a peripheral portion of the supply pipe. The susceptor 21 includes a surface that is slanted off the horizontal and on that the substrate 20 is arranged. The susceptor 21 is made of quartz. Since the susceptor 21 and the supply pipe 27 that are configured to be a film-formation chamber are made of quartz, this configuration reduces a possibility that a foreign substance entering a film that is formed on the substrate 20.

2. Preparation of a Raw-Material Solution

To make a raw material solution, rhodium acetylacetonate (rhodium concentration 0.001 mol/L) was mixed to be 75 mol % and gallium acetylacetonate (gallium concentration is 0.001 mol/L) was mixed to be 25 mol % in the raw material solution.

3. Film Formation Preparation

The raw material solution 24a obtained at 2. Preparation of the Raw-Material Solution above was set in the mist generator 24. Then, as a substrate 20, a c-plane sapphire substrate was placed on the susceptor 21, and the heater 28 was activated to raise the temperature in the film-formation chamber 27 up to 500° C. The first flow-control valve 23a and the second flow-control valve 23b were opened to supply a carrier gas from the carrier gas supply device 22a and the diluted carrier gas supply device 22b, which are the source of carrier gas, into the film-formation chamber 27 to replace the atmosphere in the film-formation chamber 27 with the carrier gas sufficiently. After the atmosphere in the film formation chamber 27 was sufficiently replaced with the carrier gas, the flow rate of the carrier gas from the carrier gas supply device 22a was regulated at 5.0 L/min, and the diluted carrier gas from the diluted carrier gas supply device 22b was regulated at 0.5 L/min. In this embodiment, oxygen was used as the carrier gas.

4. Formation of a Film

The ultrasonic transducer 26 was then vibrated at 2.4 MHz, and the vibration propagated through the water 25a to the raw material solution 24a to atomize the raw material solution 24a to form atomized droplets. The atomized droplets was introduced in the film formation chamber 27 with the carrier gas. The atomized droplets was thermally reacted at 500° C. under atmospheric pressure in the film formation chamber 27 to form a film on the substrate 20. The film formation time was 2 hours and the film thickness was 100 nm.

Figure 2:
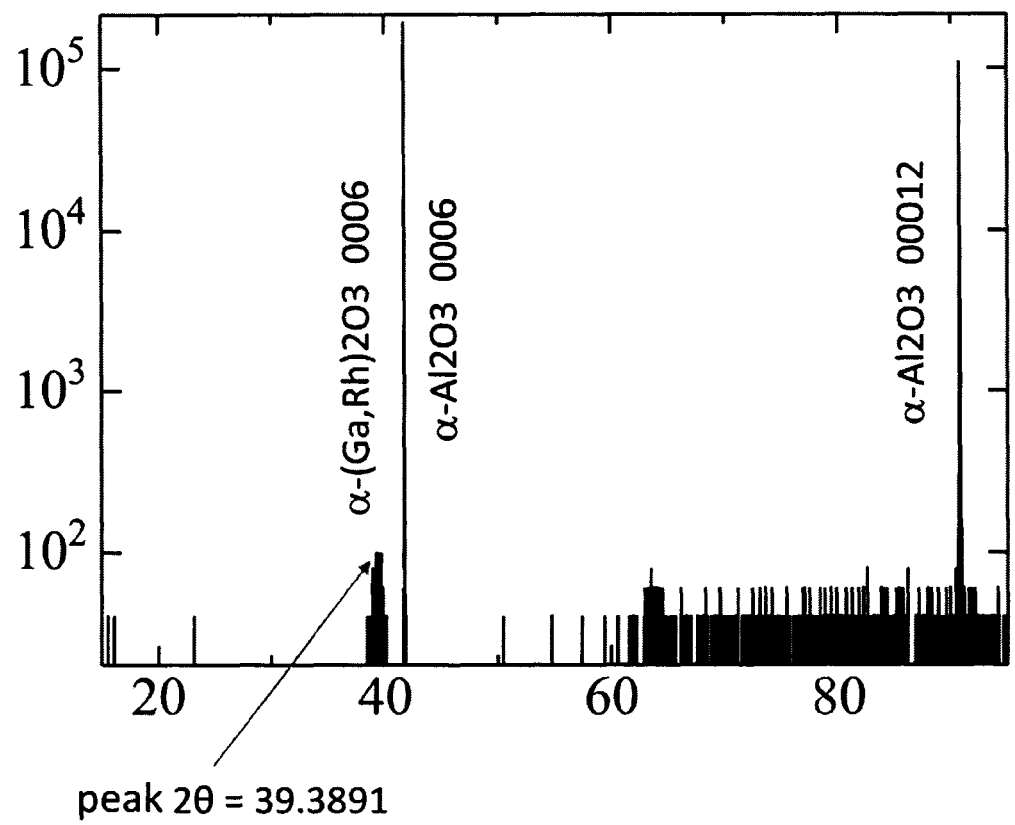
FIG. 2 shows a measurement result of an embodiment measured by an X-ray diffraction (XRD). The horizontal axis indicates an angle of diffraction (deg.) and the vertical axis indicates an intensity of diffraction (arb. Unit)

Using an X-ray diffraction (XRD) device, a phase of the film obtained at 4. Formation of a film described above was identified as $(Rh_{0.92}Ga_{0.08})_2O_3$. FIG. 2 shows a result of XRD. Also, a Hall effect of the obtained $(Rh_{0.92}Ga_{0.08})_2O_3$ film was measured and revealed that a carrier type of the film was defined as p-type, carrier density of the film was $7.6 \times 10^{17}$ (/cm$^3$), and mobility of the film was 1.01 (cm$^2$/Vs).

INDUSTRIAL APPLICABILITY

A p-type oxide semiconductor of the present inventive subject matter is applicable as semiconductor devices (e.g., compound semiconductor devices) and electric components and electronic devices, optical and electronic photography related devices, and industrial parts. Since the p-type oxide semiconductor according to the present inventive subject matter has an enhanced p-type semiconductor property, the p-type oxide semiconductor is, in particular, applicable to semiconductor devices.

REFERENCE NUMBER DESCRIPTION

19 Mist CVD apparatus
20 a substrate
21 a susceptor
22a a carrier gas supply device
22b a diluted carrier gas supply device
23a a flow-control valve
23b a flow-control valve
24 a mist generator
25 a vessel
26 an ultrasonic transducer
27 a supply pipe
28 a heater
29 an air duct
101a an n$^-$-type semiconductor layer
101b an n$^+$-type semiconductor layer
103 a metal layer
104 an insulating layer
105a a Schottky electrode
105b an Ohmic electrode
121a n-type semiconductor layer with wide band gap
121b n-type semiconductor layer with narrow band gap
121c an n+-type semiconductor layer
123 a p-type semiconductor layer
125a a gate electrode
125b a source electrode
125c a drain electrode
128 a buffer layer
129 a substrate
131a an n$^-$-type semiconductor layer
131b a first n$^+$-type semiconductor layer
131c a second n$^+$-type semiconductor layer
132 a p-type semiconductor layer
134 a gate insulating film
135a a gate electrode
135b a source electrode
135c a drain electrode
138 a buffer layer
139 a semi-insulating layer
141a an n$^-$-type semiconductor layer
141b a first n$^+$-type semiconductor layer
141c a second n$^+$-type semiconductor layer
142 a p-type semiconductor layer
145a a gate electrode
145b a source electrode
145c a drain electrode 151 an n-type semiconductor layer
151a an n⁻-type semiconductor layer
151b an n⁺-type semiconductor layer
152 a p-type semiconductor layer
154 a gate insulating layer
155a a gate electrode
155b an emitter electrode
155c a collector electrode
161 an n-type semiconductor layer
162 a p-type semiconductor layer
163 a light emitting diode
165a a first electrode
165b a second electrode
167 a translucent electrode
169 a substrate

What is claimed is:

1. A semiconductor device comprising:
a p-type semiconductor layer comprising, as a first major component, a metal oxide, the metal oxide being a mixed crystal of an oxide of a Group 9 metal in a periodic table and gallium oxide;
an n-type semiconductor layer provided on the p-type semiconductor layer, the n-type semiconductor layer comprising, as a second major component, a crystalline oxide semiconductor that comprises at least gallium; and
an electrode; wherein the mixed crystal has a corundum structure; wherein the crystalline oxide semiconductor has a corundum structure.

2. The semiconductor device according to claim 1, wherein the Group 9 metal is 10% or more in atomic ratio in the metal oxide except oxygen of the metal oxide.

3. A semiconductor system comprising:
the semiconductor device according to claim 2.

4. The semiconductor device according to claim 1, wherein the gallium is 5% or more in atomic ratio in the metal oxide except oxygen of the metal oxide.

5. A semiconductor system comprising:
the semiconductor device according to claim 4.

6. A semiconductor system comprising:
the semiconductor device according to claim 1.

* * * * *